United States Patent
Dubeyko et al.

(10) Patent No.: US 10,223,216 B1
(45) Date of Patent: Mar. 5, 2019

(54) NON-VOLATILE STORAGE SYSTEM THAT RECLAIMS BAD BLOCKS

(71) Applicant: Western Digital Technologies, Inc., San Jose, CA (US)

(72) Inventors: Viacheslav Anatolyevich Dubeyko, San Jose, CA (US); Seung-Hwan Song, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/798,029

(22) Filed: Oct. 30, 2017

(51) Int. Cl.
*G11C 29/00* (2006.01)
*G06F 11/16* (2006.01)

(52) U.S. Cl.
CPC .......... *G06F 11/1658* (2013.01); *G11C 29/88* (2013.01); *G06F 2201/805* (2013.01); *G06F 2201/82* (2013.01)

(58) Field of Classification Search
CPC .......... G06F 11/1658; G06F 2201/805; G06F 2201/82; G11C 29/88; G11C 29/00
USPC ............ 365/185.01, 185.02, 185.03, 185.05, 365/185.06, 185.1, 185.11, 185.17, 365/185.21, 185.22, 200
See application file for complete search history.

(56) References Cited

U.S. PATENT DOCUMENTS

| 8,732,519 | B2 | 5/2014 | Sun |
| 2016/0180926 | A1 | 6/2016 | Young |
| 2017/0330635 | A1* | 11/2017 | Shepard ................. G11C 29/76 |

OTHER PUBLICATIONS

Agrawal, et al., "A Five-Year Study of File-System Metadata," ACM Transactions on Storage (TOS), vol. 3 Issue 3, Oct. 2007, Article No. 9.
Anthony, "Self-healing, self-heating flash memory survives more than 100 million cycles," Dec. 3, 2012, available at: https://www.extremetech.com/computing/142096-self-healing-self-heating-flash-memory-survives-more-than-100-million-cycles.
Douceur, et al., "A Large-Scale Study of File-System Contents," SIGMETRICS '99 Proceedings of the 1999 ACM SIGMETRICS international conference on Measurement and modeling of computer systems, pp. 59-70, May 1-4, 1999.
Lee, et al., "Effects of Interface Trap Generation and Annihilation on the Data Retention Characteristics of Flash Memory Cells," IEEE Transactions on Device and Materials Reliability, Volume: 4, Issue: 1, Mar. 2004.
Wu, et al., "A First Study on Self-Healing Solid-State Drives," 3rd IEEE International Memory Workshop (IMW), May 22-25, 2011.
Wu, et al., "A First Study on Self-Healing Solid-State Drives," Published in IMW-2011, Erik Jonsson School of engineering and Computer Science, The University of Texas at Dallas, Apr. 11, 2014.
Shepard, "Using Non-Volatile Memory Bad Blocks," U.S. Appl. No. 15/150,765, filed May 10, 2016.

* cited by examiner

Primary Examiner — Harry W Byrne
(74) Attorney, Agent, or Firm — Vierra Magen Marcus LLP

(57) ABSTRACT

A non-volatile storage system is configured to reclaim bad blocks. One embodiment includes determining that a block of non-volatile memory cells is a bad block, leaving the block idle for a period of time to allow for self-curing of the block, verifying success of the self-curing, refreshing the block, verifying that the refresh was successful and subsequently using the block to store host data.

13 Claims, 14 Drawing Sheets

| S0 | S1 | S2 | S3 | S4 | S5 | S6 | S7 |
|----|----|----|----|----|----|----|----|
| 1  | 1  | 1  | 0  | 0  | 0  | 0  | 1  |
| 1  | 1  | 0  | 0  | 1  | 1  | 0  | 0  |
| 1  | 0  | 0  | 0  | 0  | 1  | 1  | 1  |

NON-VOLATILE STORAGE SYSTEM THAT RECLAIMS BAD BLOCKS

BACKGROUND

Semiconductor memory is widely used in various electronic devices such as cellular telephones, digital cameras, personal digital assistants, medical electronics, mobile computing devices, servers, solid state drives ("SSDs"), non-mobile computing devices and other devices. Semiconductor memory may comprise non-volatile memory or volatile memory. A non-volatile memory allows information to be stored and retained even when the non-volatile memory is not connected to a source of power (e.g., a battery).

As some non-volatile memory is subjected to many program and erase cycles, performance and reliability can degrade. In some instances, blocks of non-volatile memory cells can fail causing the system to retire the block from future use. While retiring the block from future use does maintain device reliability, retiring bad blocks does reduce capacity of the memory.

BRIEF DESCRIPTION OF THE DRAWINGS

Like-numbered reference numbers in the drawings refer to common components in the different figures.

DETAILED DESCRIPTION

Technology is proposed for reclaiming bad blocks. When some non-volatile memory is subjected to many program and erase cycles, unwanted charge can accumulate in the tunneling dielectric (or other regions) of the memory cells. This unwanted accumulation of charge can cause a good block of memory to become a bad block. It has been found that allowing a bad block to remain idle over a long period of time (e.g., 1-2 months) results in some of the unwanted accumulation of charge dissipating such that the bad block of memory becomes a good block. Therefore, it is proposed that in response to determining that a particular block of memory is a bad block, the particular block of memory will be left idle for a period of time such that no programming, reading or erasing is performed for the particular block during the period of idle time; however, programming is performed for other blocks or memory during that period of time. After the period of time for being idle has completed, the system tests whether the particular block of memory is a bad block or a good block. If the particular block of memory is now a good block again, then the particular block of memory can be used to store host data in the same manner that other good blocks are used.

Figure 1:
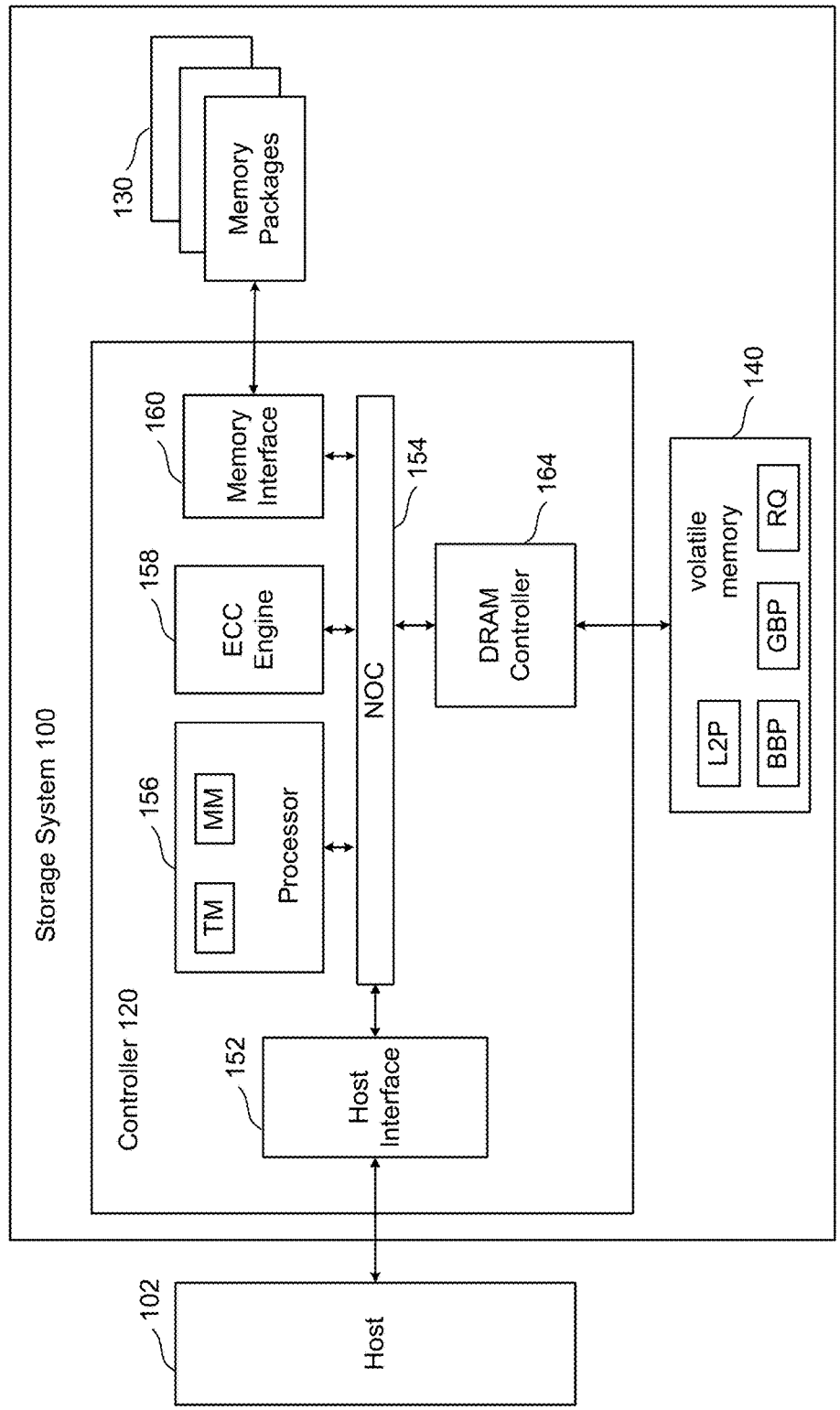
FIG. 1 is a block diagram depicting one embodiment of a storage system.

FIG. 1 is a block diagram of one embodiment of a storage system 100 that implements the proposed technology for reclaiming bad blocks. In one embodiment, storage system 100 is a SSD. Storage system 100 can also be a memory card, USB drive or other type of storage system. The proposed technology for reclaiming bad blocks is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a controller 120 connected to one or more memory packages 130 and local high speed volatile memory 140 (e.g., DRAM). Memory packages 130 comprise a plurality of memory die that each comprise a plurality of non-volatile memory cells. More information about the structure of memory packages 130 is provided below with respect to FIGS. 2-6B. Local high speed volatile memory 140 is used by controller 120 to perform certain functions. For example, local high speed volatile memory 140 stores L2P tables (L2P), the bad block pool (BBP), the good block pool (GBP) and the refresh queue (RQ), all of which will be described in more detail below.

Controller 120 comprises a host interface 152 that is connected to and in communication with host 102. In one embodiment, host interface 152 provides a PCIe interface. Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the processor 156, ECC engine 158, memory interface 160, and DRAM controller 164. The DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. More details about error correction are provided below. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations. For example, memory module (MM) is a process running on processor 156 for performing programming, erasing, reading, as well as memory management processes. In one embodiment, processor 156 is programmed by firmware. In other embodiments, processor 156 is a custom and dedicated hardware circuit without any software. As will be discussed in more detail below, processor 156 (alone or with ECC engine 158) can determine that a block of non-volatile memory cells is a bad block, allow the block to passively self-cure without applying additional heat and use the block to store host data subsequent to the self-cure. During self-cure, the block will not be used to store host data.

Processor 156 also implements a translation module (TM), as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To enable this system, the controller (e.g., the translation module TM) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in the memory packages 130 and a subset of the L2P tables are cached (L2P cache) in the local memory 140.

Memory interface 160 communicates with multiple memory packages 130. In one embodiment, memory interface provides a Toggle Mode interface. In some example implementations, memory interface 160 (or another portion of controller 120) implements a scheduler and buffer for transmitting data to and receiving data from one or more memory die.

Figure 2:
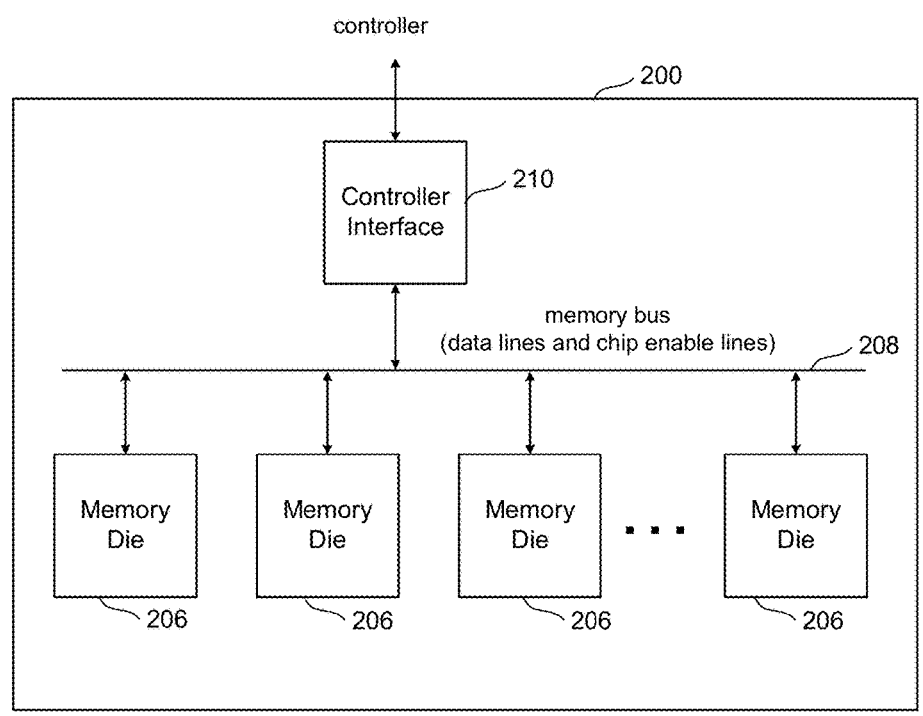
FIG. 2 is a block diagram depicting one embodiment of a memory package.

FIG. 2 is a block diagram of one embodiment of a memory package 200, which is an example implementation of a memory package included in memory packages 130 of FIG. 1. FIG. 2 shows a plurality of memory die 206 connected to a memory bus (data lines and chip enable lines) 208. The memory bus 208 connects to a controller interface 210, which is an electrical circuit for interfacing with memory interface 160 of controller 120. In one embodiment, controller interface is a Toggle Mode interface for communicating with a Toggle Mode Interface of memory interface 160. In some embodiments, the memory package can include a small controller connected to the memory bus 208. In one embodiment, each memory package includes eight or sixteen memory die; however, other numbers of memory die can also be implemented. The technology described herein is not limited to any particular number of memory die.

Figure 3:
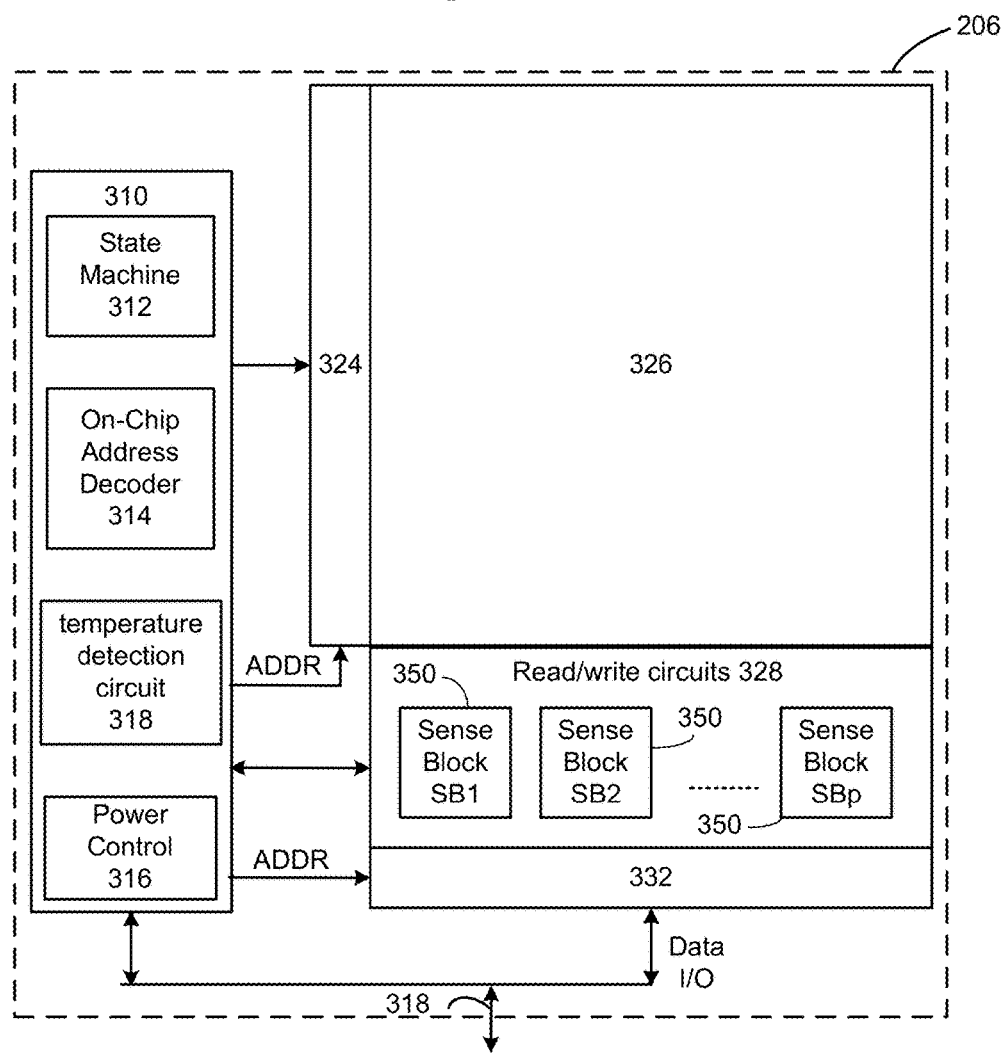
FIG. 3 is a block diagram of one embodiment of a memory die.

FIG. 3 is a functional block diagram of one embodiment of a memory die 206. The components depicted in FIG. 3 are electrical circuits. Memory die 206 includes a three dimensional memory structure 326 of memory cells (such as, for example, a 3D array of memory cells), control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. Commands and data are transferred to/from memory die 300 via lines 318. In one embodiment, memory die 300 includes a set of input and/or output (I/O) pins that connect to lines 318.

Memory structure 326 may comprise one or more arrays of memory cells including a monolithic three dimensional array of non-volatile memory cells in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate.

Control circuitry 310 cooperates with the read/write circuits 328 to perform memory operations (e.g., erase, program, read, and others) on memory structure 326, and includes a state machine 312, an on-chip address decoder 314, a power control module 316 and a temperature detection circuit 318. The state machine 312 provides die-level control of memory operations. Temperature detection circuit 318 is configured to detect temperature at the memory structure 326, and can be any suitable temperature detection circuit known in the art. In one embodiment, state machine 312 is programmable by software. In other embodiments, state machine 312 does not use software and is completely implemented in hardware (e.g., electrical circuits). In one embodiment, control circuitry 310 includes registers, ROM fuses and other storage devices for storing default values such as base voltages and other parameters. The on-chip address decoder 314 provides an address interface between addresses used by a host or controller to the hardware address used by the decoders 324 and 332. Power control module 316 controls the power and voltages supplied to the word lines and bit lines during memory operations. Power control module 316 may include charge pumps for creating voltages. The sense blocks include bit line drivers. Note that any one or combination of control circuitry 319, state machine 312 or controller 120 can be thought of as one or more control circuits for performing the processes discussed below.

Multiple memory cells in memory structure 326 may be configured so that they are connected in series or so that each element is individually accessible. By way of non-limiting example, flash memory devices in a NAND configuration (NAND flash memory) typically contain memory cells connected in series. A NAND string is an example of a set of series-connected memory cells and select gate transistors that can be used to implement memory structure 326 as a three-dimensional memory structure. A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array. By way of non-limiting example, in a three dimensional NAND memory array, the memory elements may be coupled together to form vertical NAND strings with charge-trapping material that traverse across multiple horizontal memory device levels. One example of a three dimensional NAND memory array that can be used to implement memory structure 126 can be found in U.S. Pat. No. 9,343,156, incorporated herein by reference in its entirety.

Although one example includes a three dimensional memory structure 326 that comprises vertical NAND strings with charge-trapping material, other (2D and 3D) memory structures can also be used with the technology described herein. For example, floating gate memories (e.g., NAND-type and NOR-type flash memory), ReRAM memories, magnetoresistive memory (e.g., MRAM), phase change memory (e.g., PCM), and conductive bridge memory elements can also be used. A person of ordinary skill in the art will recognize that the technology described herein is not limited to a single specific memory structure, but covers many relevant memory structures within the spirit and scope of the technology as described herein and as understood by one of ordinary skill in the art.

Figure 4:
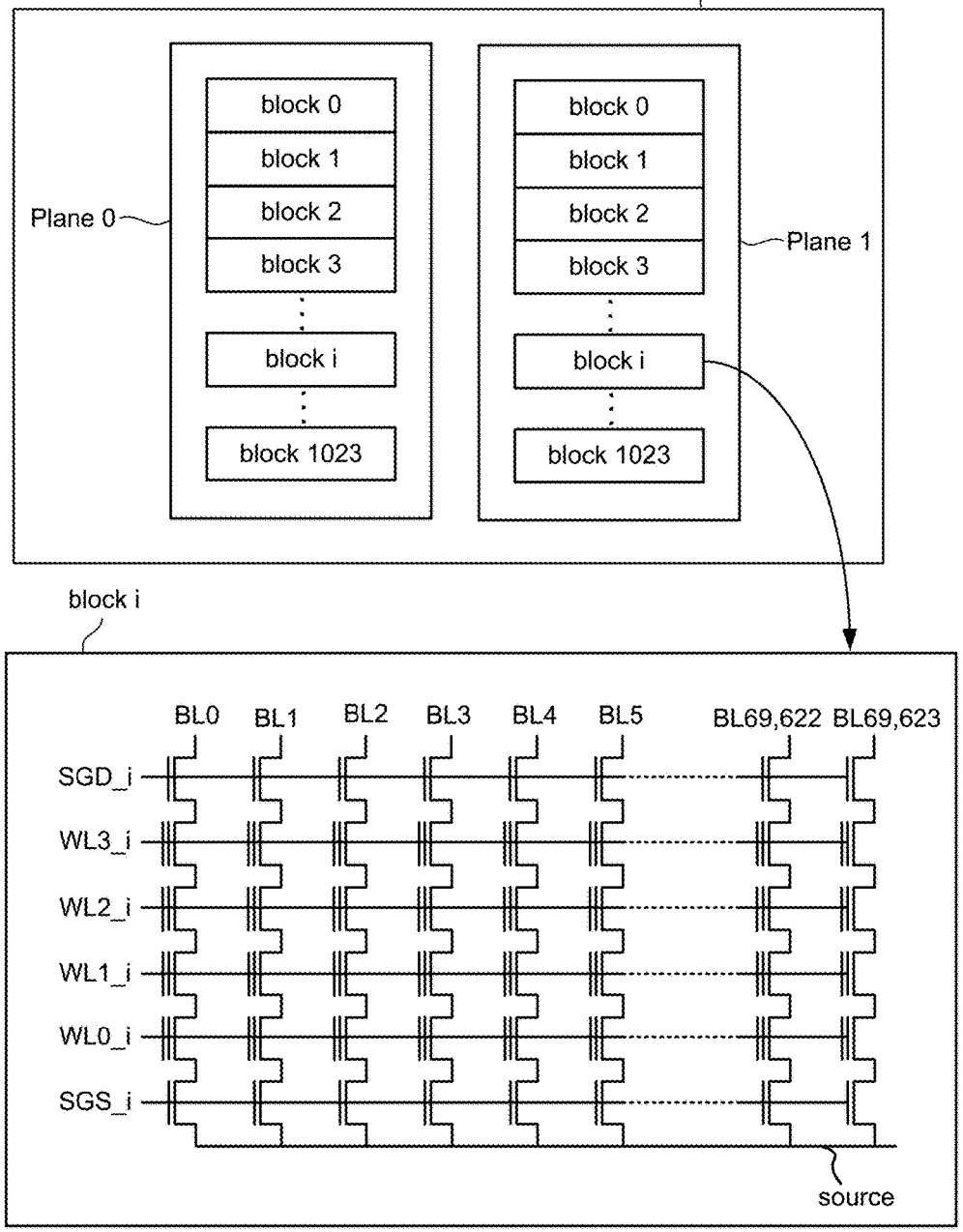
FIG. 4 is a block diagram of one embodiment of a memory array.

FIG. 4 depicts one example of memory structure 326. In one embodiment, memory structure 326 is an array of memory cells is divided into multiple planes. In the example of FIG. 4, memory structure 326 is divided into two planes: Plane 0 and Plane 1. In other embodiments, more or less than two planes can be used. In some embodiments, each plane is divided into a large number of blocks (e.g., blocks 0-1023, or another amount). Each block include many memory cells.

In one embodiment, the block is the unit of erase and, therefore, is sometimes referred to as an erase block. That is, each block contains the minimum number of memory cells that are erased together. Other units of erase can also be used.

In one embodiment, a block contains a set of NAND strings which are accessed via bit lines (e.g., bit lines BL0-BL69,623) and word lines (WL0, WL1, WL2, WL3). FIG. 4 shows four memory cells connected in series to form a NAND string. Although four memory cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate and another terminal is connected to the source line via a source select gate. Although FIG. 4 shows 69624 bit lines, a different number of bit lines can also be used. Additionally, as discussed above, the block can implement non-volatile storage technologies other than NAND flash memory.

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. One example of a page can be all of the data stored in the memory cells connected to a common word line and in a common block. Another example of a page is a fraction (e.g., ¼, ½, ⅓) of the memory cells connected to a common word line and in a common block or a fraction of the bits stored in those memory cells. A page includes host data and overhead data (also called system data). Overhead data typically includes header information and Error Correction Codes (ECC) that have been calculated from the host data of the sector. The controller (or other component) calculates the ECC when data is being programmed into the array, and also checks it when data is being read from the array.

Figure 5:
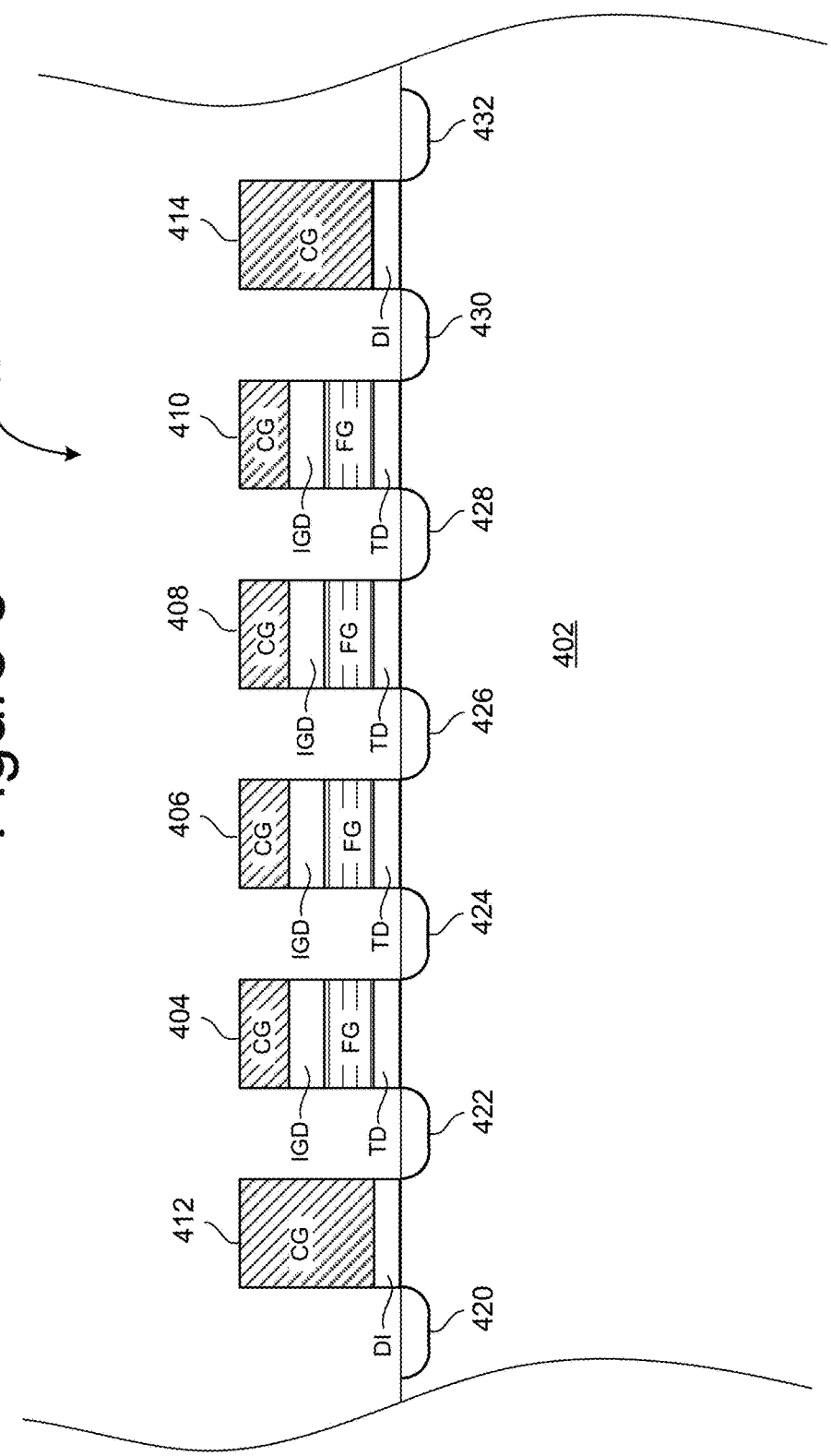
FIG. 5 is a cross section of a NAND string.

In one embodiment, memory structure 326 is a two dimensional memory array of flash memory cells, where the flash memory cells each include floating gates and are arranged in NAND strings (as depicted in FIG. 4). FIG. 5 is a cross section of a NAND string 400 implemented on a silicon substrate 402. NAND string 400 include stacks 404, 406, 408 and 410, each of which implements a non-volatile memory cell. Each of stacks 404, 406, 408 and 410 comprise a control gate CG (e.g., Tungsten), a floating gate FG (e.g., poly-silicon), an Inter-gate dielectric regions IGD (e.g., $SiO_2$) between the respective control gate and floating gate, and a tunnel dielectric TD (e.g., $SiO_2$) between the respective floating gate FG and substrate 402. In one embodiment, the control gates CG form the word lines. N+ doped regions 410, 411, 424, 426, 428, 420 and 432 in substrate 402 are shared between neighboring stacks 404, 406, 408 and 410 to form the transistors of the memory cells. For each memory cell, one of the N+ doped regions is the drain and the other N+ doped region is the source. One end of NAND string 400 is connected to a corresponding bit line via a drain select gate 414, and another end of NAND string 400 is connected to the source line via a source select gate 412. Drain select gate 414 comprises a control gate CG and a dielectric region DI between its control gate CG and substrate 402. Source select gate 412 comprises a control gate CG and a dielectric region DI between its control gate CG and substrate 402. Although the NAND string of FIG. 4 comprises four memory cells connected in series to form a NAND string, more or less than four memory cells can be used to form a NAND string (e.g., 16, 32, 64, 128, 256 or another number or memory cells can connected to form a NAND string).

When programming a flash memory cell of FIG. 5, a program voltage is applied to the control gate and the bit line is grounded. Electrons from the substrate 402 (e.g., a p-well in the substrate 402) are injected into the floating gate FG via the tunnel dielectric TD. When electrons accumulate in the floating gate, the floating gate becomes negatively charged and the threshold voltage of the memory cell is raised.

Memory cells are erased by raising the substrate 402 (e.g., a p-well in the substrate) to an erase voltage (e.g. 20 volts) and grounding the word lines (i.e. control gates CG) of a selected block. The source and bit lines are floating. In one embodiment, erasing is performed on an entire block (making the block the unit of erase). Electrons are transferred from the floating gate FG to the substrate 402 (e.g., a p-well in the substrate), via the tunnel dielectric, and the threshold voltage decreases.

Figure 6A:
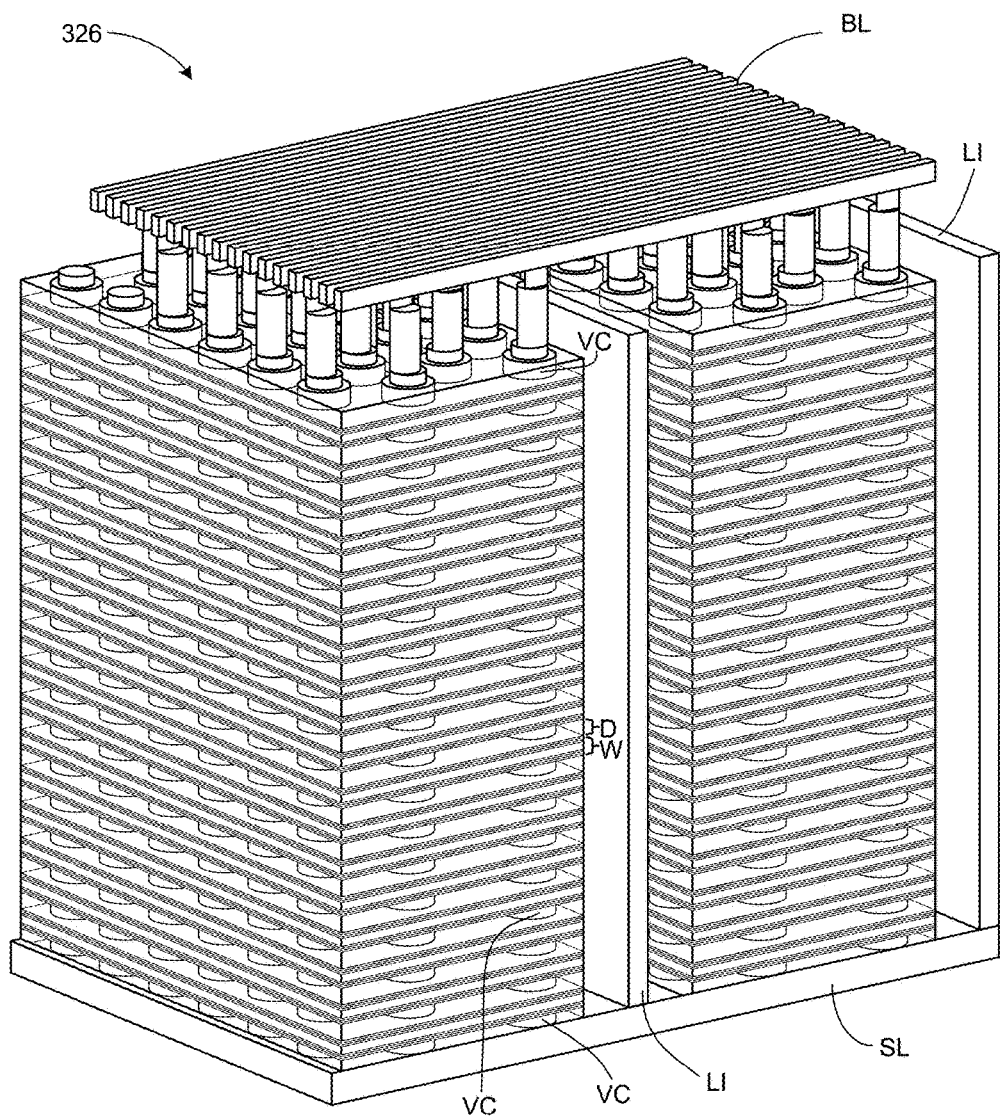
FIG. 6A is a perspective view of a monolithic three dimensional flash memory that includes vertical NAND strings having charge trapping layers.

In another embodiment, memory structure 326 comprises a monolithic three dimensional memory structure in which multiple memory levels are formed above (and not in) a single substrate, such as a wafer, with no intervening substrates. FIG. 6A is a perspective view of a portion of such a memory structure 326, depicting a portion of one block of memory cells. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. The alternating dielectric layers and conductive layers are divided into four sub-blocks by local interconnects LI. FIG. 6A only shows two sub-blocks and two local interconnects LI. Below the alternating dielectric layers and word line layers is a source line layer SL. Memory holes are formed in the stack of alternating dielectric layers and conductive layers, and filled in with vertical columns. For example, one of the vertical columns is marked as VC. Note that in FIG. 6A, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data.

Figure 6B:
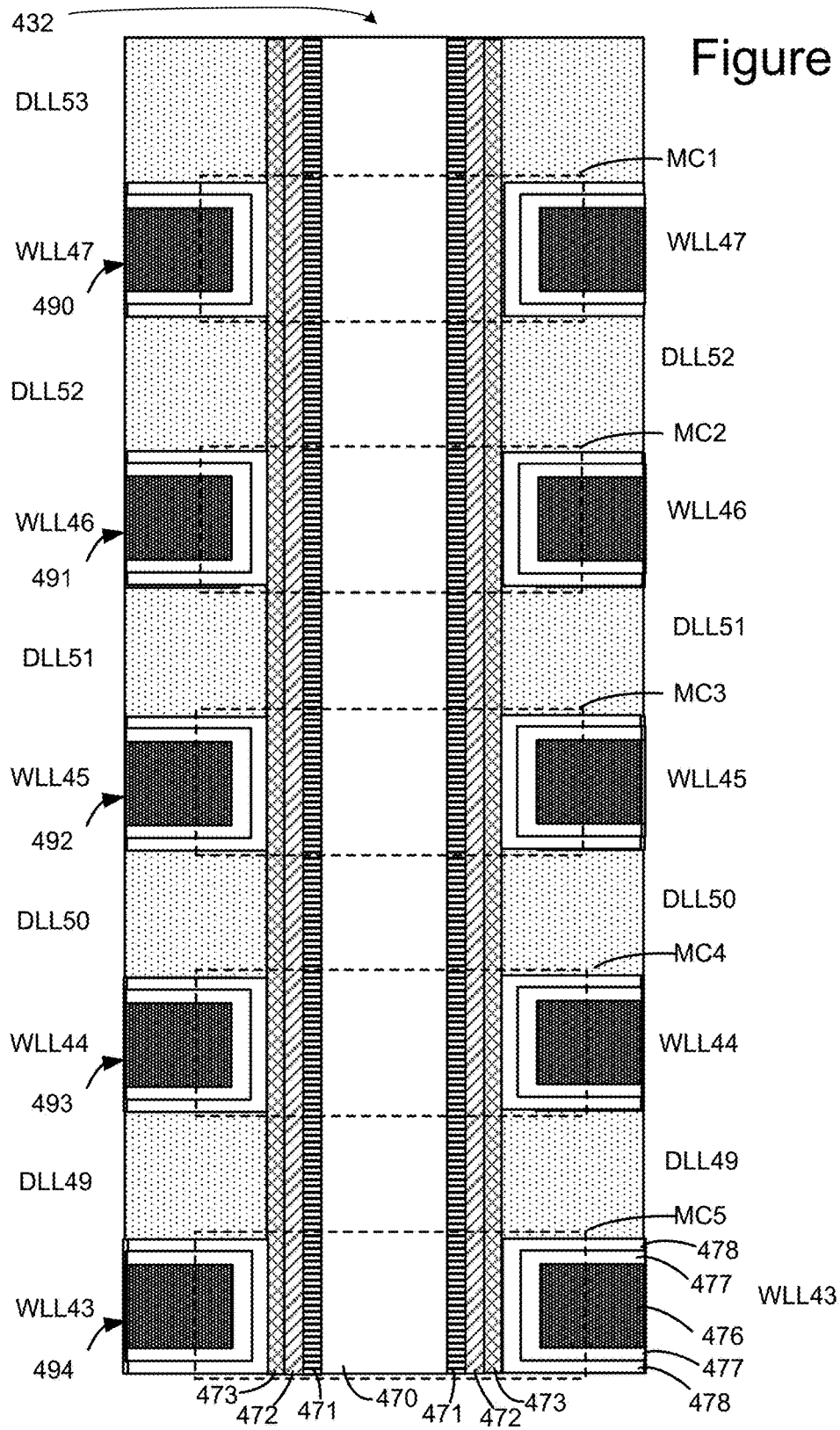
FIG. 6B is a cross section of a portion of a vertical NAND string.

FIG. 6B depicts a cross sectional view of a portion of one of the vertical columns of the memory array depicted in FIG. 6A. In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 6B depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figures 7, 8:
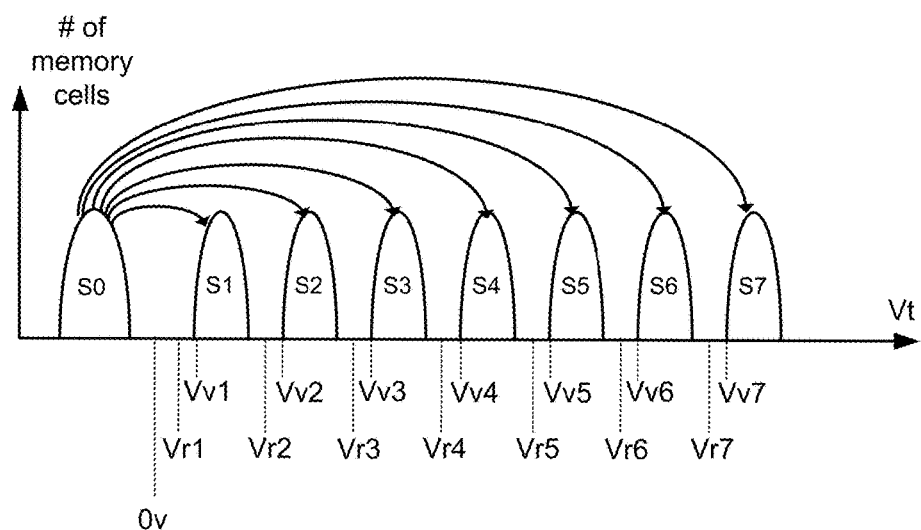
FIG. 7 depicts threshold voltage distributions.
FIG. 8 is a table describing one example of an assignment of data values to data states.

The memory discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 7 illustrates example threshold voltage distributions for the memory cell array when each memory cell stores three bits of data. Other embodiments, however, may use other data capacities per memory cell (e.g., such as one, two, four, or five bits of data per memory cell). FIG. 7 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 7 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 7 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2 (it should be not greater than Vr3). When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 7 represent the full sequence programming. The technology described herein can also be used with other types of programming in addition to full sequence programming (including, but not limited to, multiple stage/phase programming). In some embodiments, data states S1-S7 can overlap, with controller 120 relying on ECC to identify the correct data being stored.

FIG. 8 is a table describing one example of an assignment of data values to data states. In the table of FIG. 8, S0=111. S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state. In the embodiment of FIG. 8, all bits stored in a memory cell are 1 when the memory cells is erased (e.g., in data state S0).

Figure 9A:
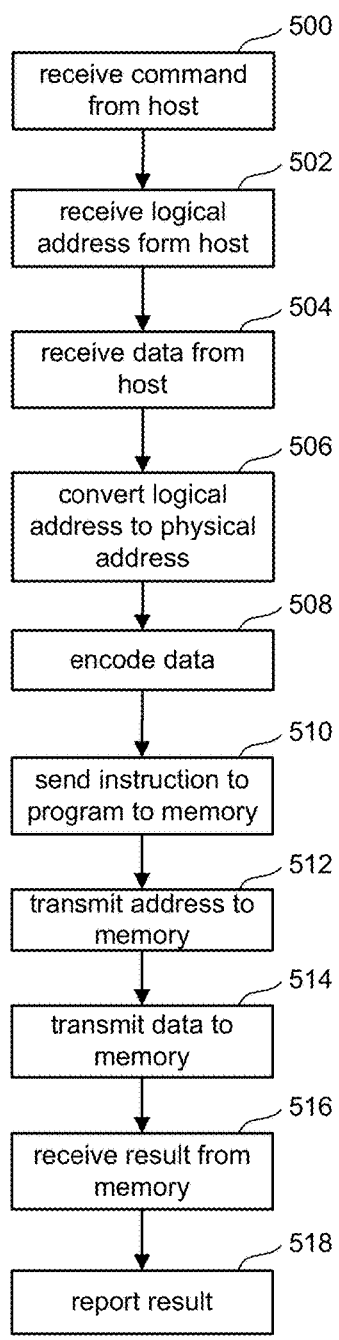
FIG. 9A is a flow chart describing one embodiment of a process for programming.

FIG. 9A is a flowchart describing one embodiment of a process for programming that is performed by controller 120. In some embodiments, rather than have a dedicated controller, the host can perform the functions of the controller. The process of FIG. 9A can be performed in response to receiving a programming command from host 140 or as part of a system operation at the direction of controller 120, such as during a defragmentation process. In step 500, controller 120 receives a command to program from host 102 (via host interface 152). In step 502, controller 120 receives a logical address from host 102 (via host interface 152). In step 504, controller 120 receives data from host 102 (via host interface 152). The data received in step 504 is to be programmed into the memory packages 130 at the logical address received in step 502. In step 506, controller 120 converts the logical address received in step 502 to a physical address in memory 130 using translation manager TM and the L2P tables (see FIG. 1).

In step 508, ECC engine 158 encodes the data to add ECC information. For example, ECC engine 158 is used to create code words. In one embodiment, data is programmed in units of pages. So, for example, the process of FIG. 9A is used to program one page of data. Because it is possible that errors can occur when programming or reading, and errors can occur while storing data (e.g., due to electrons drifting, data retention issues or other phenomenon), error correction is used with the programming of a page of data. Many error correction coding schemes are well known in the art. These conventional error correction codes (ECC) are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word. In other embodiments, the actual data is changed.

The particular parameters for a given error correction code include the type of code, the size of the block of actual data from which the code word is derived, and the overall length of the code word after encoding. For example, a typical BCH code applied to 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, the Controller receives host data, also referred to as information bits, that is to be stored in a memory structure 326. The informational bits are represented by the matrix i=[1 0] (note that two bits are used for example purposes only, and many embodiments have code words longer than two bits). An error correction coding process (such as any of the processes mentioned above or below) is implemented in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied to multiple pages encoded across a number of storage elements, but they do not need to be applied across multiple pages. The data bits can be mapped to a logical page and stored in three dimensional memory structure 126 by programming one or more memory cells to one or more programming states, which corresponds to v.

In one possible implementation, an iterative probabilistic decoding process is used which implements error correction decoding corresponding to the encoding implemented in controller 120. Further details regarding iterative probabilistic decoding can be found in the above-mentioned D. MacKay text. The iterative probabilistic decoding attempts to decode a code word by assigning initial probability metrics to each bit in the code word. The probability metrics indicate a reliability of each bit, that is, how likely it is that the bit is not in error. In one approach, the probability metrics are logarithmic likelihood ratios LLRs which are obtained from LLR tables. LLR values are measures of the reliability with which the values of various binary bits read from the storage elements are known.

$$Q = \log_2 \frac{P(v=0|Y)}{P(v=1|Y)},$$

The LLR for a bit is given by where $P(v=0|Y)$ is the probability that a bit is a 0 given the condition that the state read is Y, and $P(v=1|Y)$ is the probability that a bit is a 1 given the condition that the state read is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a code word. Further, the LLR tables can account for the multiple read results so that an LLR of greater magnitude is used when the bit value is consistent in the different code words.

Controller 120 receives the code word Y1 and the LLRs and iterates in successive iterations in which it determines if parity checks of the error encoding process have been satisfied. If all parity checks have been satisfied, the decoding process has converged and the code word has been error corrected. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of Y1 is completed to obtain the decoded information including parity bits v and the decoded information bits i.

Looking back at FIG. 9A, in step 510 controller 120 sends instructions to one or more memory die 206 to program data. In step 512, controller 120 sends one or more physical addresses to one or more memory die 206. The one or more addresses indicate where to program the data. In step 514, controller 120 sends the data to be programmed to the one or more memory die 206. For example, the code words that are the result of the ECC process are transferred. In step 516, controller 120 receives a result of the programming from the one or more memory die 206. Example results include an indication that the data was programmed successfully, an indication that the programming operation failed, and indication that the data was programmed but at a different location, or other result. In step 518, in response to the result received in step 516, controller 120 reports the results to host 102 (via host interface 152).

In some embodiments of the process of FIG. 9A, if the data is the first set of data being programmed to a target block, then prior to instructing the memory die 206 to program in step 510 the controller 120 will instruct the memory die to erase the block. The overall process of erasing a block and then programming data to the block is known as a program and erase cycle. In one example, each erase process performed on a block indicates another program and erase cycle.

Figure 9B:
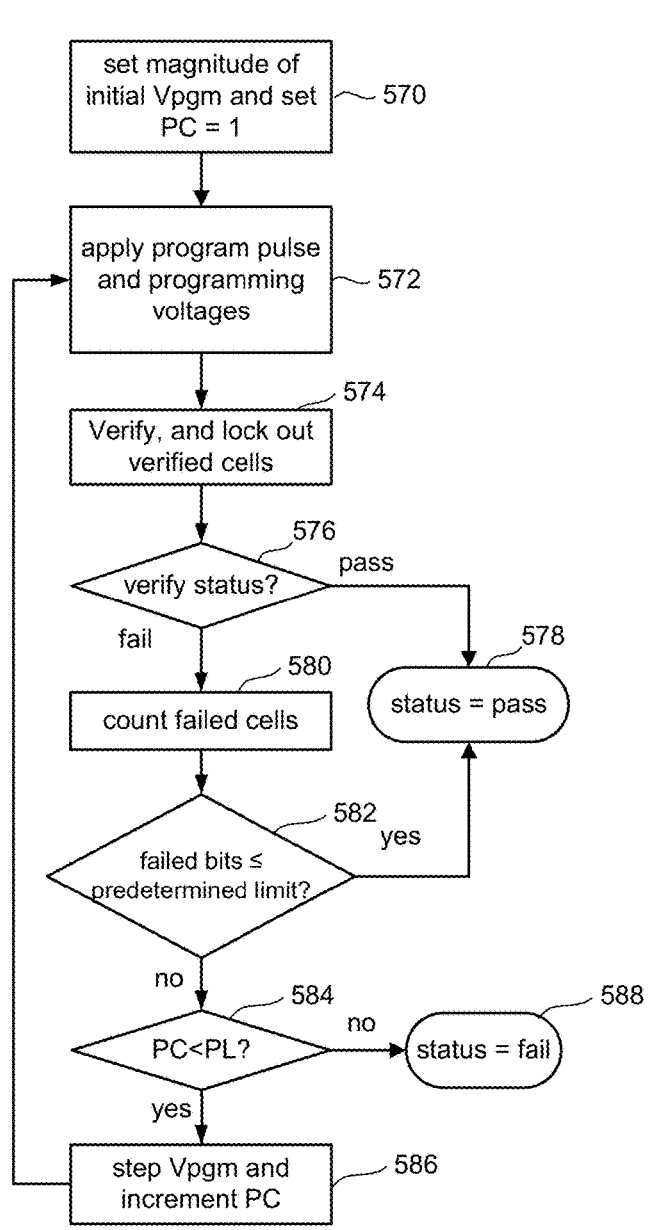
FIG. 9B is a flow chart describing one embodiment of a process for programming data into memory cells connected to a common word line.

FIG. 9B is a flowchart describing one embodiment of a process for programming. The process of FIG. 9B is performed by the memory die 206 in response to the steps of FIG. 9A (i.e., in response to the instructions, data and addresses from controller 120). In one example embodiment, the process of FIG. 9B is performed on memory die 206 at the direction of state machine 312. The process of FIG. 9B can be used to implement the full sequence programming discussed above. Alternatively, the process of FIG. 9B can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 570 of FIG. 9B, the programming voltage (Vpgm) is initialized to the starting magnitude (e.g., ~12-16V or another suitable level) and a program counter PC maintained by state machine 312 is initialized at 1. In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 572, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 574, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage (see e.g. Vv1, Vv2, Vv3, Vv4, Vv5, Vv6, and Vv7 of FIG. 7). Memory cells that have been verified to reach their target are locked out from further iterations of the current programming process of FIG. 9B.

In step 576, it is determined whether all the memory cells have reached their target threshold voltages (pass). If so, the programming process is complete and successful because all selected memory cells were programmed and verified to their target states. A status of "PASS" is reported in step 578. If, in 576, it is determined that not all of the memory cells have reached their target threshold voltages (fail), then the programming process continues to step 580. In step 580, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is the number of bits that can be corrected by ECC during a read process for the page of memory cells. If the number of failed memory cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In another embodiment, the predetermined limit can be less than the number of bits that can be corrected by ECC during a read process to allow for future errors. Additionally, when programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not pre-determined. Instead, it changes based on the number of errors already counted for the page, the number of program and erase cycles performed or other criteria.

If number of failed memory cells is not less than the predetermined limit, than the programming process continues at step 584 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 588. This is one example of a program fault. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 586, the process loops back to step 572 and another program pulse is applied to the selected word line so that another iteration (steps 572-586) of the programming process of FIG. 9B is performed.

In general, during verify operations (step 574) and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 7) or verify operation (e.g. see verify reference voltages Vv1, Vv2, Vv3, Vv4, Vv5, Vv6, and Vv7 of FIG. 7) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 9C:
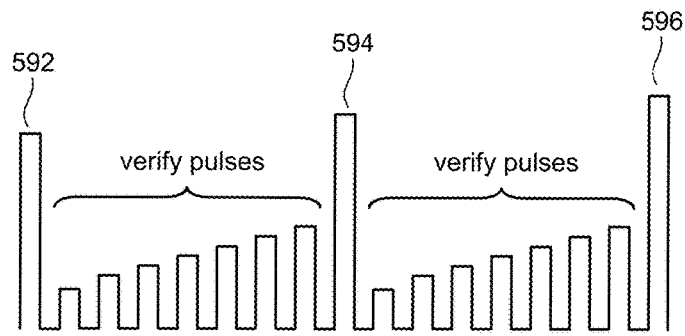
FIG. 9C depicts a word line voltage during programming and verify operations.

Step 572 of FIG. 9B includes applying a program voltage pulse on the selected word line. Step 574 of FIG. 9B includes verification, which in some embodiments comprises applying the verify reference voltages on the selected word line. As steps 572 and 574 are part of an iterative loop, the program voltage is applied as a series of voltage pulses that step up in magnitude. Between voltage pulses, verify reference voltages are applied. This is depicted in FIG. 9C, which shows program voltage pulses 592, 594 and 596, applied during three successive iterations of step 572. Between program voltage pulses 592, 594 and 596, the system tests the memory cells to determine whether threshold voltages of the memory cells are greater than the respective verify reference voltages by applying the verify references voltages as verify pulses.

Figure 10:
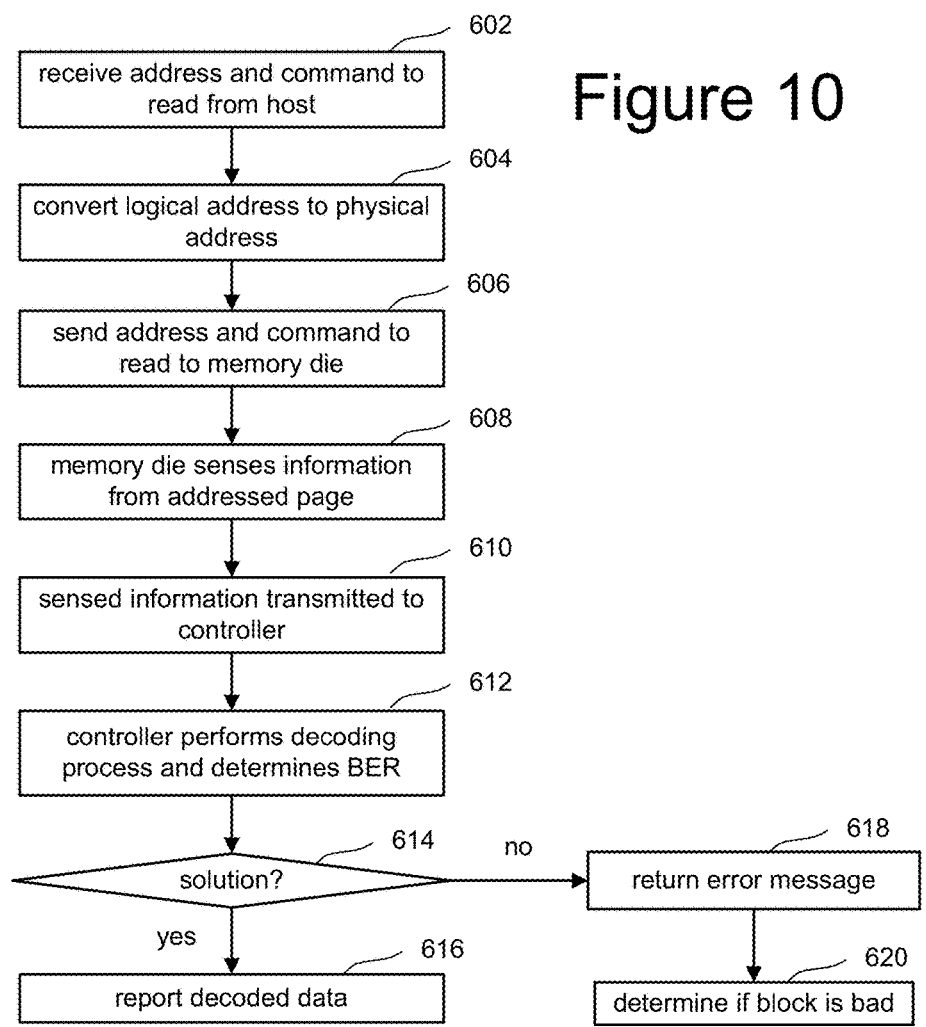
FIG. 10 is a flow chart describing one embodiment of a process for reading data from memory cells.

FIG. 10 is a flowchart describing on embodiment of a process for reading data stored in non-volatile memory (e.g., memory structure 126). In step 602, controller 120 receives a command to read data and a logical address from host 102 (via host interface 152). In step 604, controller 120 converts the logical address received in step 602 to a physical address in memory 130 using translation manager TM and the L2P tables. In step 606, controller 120 sends the physical address and a command to read data to the appropriate memory die 206. In step 608, in response to the command, memory die 206 senses information from the addressed page. In one embodiment, the address sent from controller 120 to memory die 206 is a page address and step 608 includes sensing the data state for the memory cells at the addressed page. In step 610, the sensed information is transmitted from memory die 206 to controller 120.

In step 612 of FIG. 10, controller 120 performs the ECC decoding process (see ECC engine 158). There are many different error correction processes that can be used with the technology described herein. Thus, the processes described herein, including the processes of FIGS. 9A and 10, are not limited to any one ECC technology. In one embodiment, the input of the decoding process is the information sensed in step 608. If the decoding process is successful, the output of the decoding process will be a data solution representing the data stored in the non-volatile memory. Additionally, the decoding process will identify how many errors were found in the data and were corrected by the decoding process using error correction. The number of data bits that were in error and were corrected are referred to as the bit error rate (BER). If the decoding process successfully finds a solution (step 614), then controller 120 returns the decoded data in step 616. In one embodiment, the data is returned to host 102. In other embodiments, data can be used for another process within controller 120. The BER is stored by controller 120 for analytics, logging, and/or used for predicting defects. If, in step 614 it is determined that the decoding process did not successfully find a correct solution, then in step 618 controller 120 returns an error message. The error message can be returned to host 102 or to another process in controller 120. In step 620, it is determined whether the block that was just read is a bad block. In one embodiment, the block that was just read is a bad block if it fails the read process and, therefore, it is marked as a bad block so that it is no longer used to store host data (e.g., data received from a host or entity other than the storage system). For example, controller 120 can determine that a block is bad because the decoding process did not result in a solution (e.g., too many errors to fix) or because the BER was to high; therefore, the block is added to the bad block pool BBP (see FIG. 1) and no longer used to store host data. A block can also be determined to be a bad block and placed in the bad block pool BBP if a programming operation for that block fails. In another embodiment, if the read process fails because the controller cannot decode the data, it does not necessarily mean that the block is bad. In such an embodiment, after failing to read data the system will try to erase the block. If the block erases successfully, then the block is considered a good block and can be used to store host data. If the block cannot be erased, then the block is considered a bad block and placed in the bad block pool BBP.

When some non-volatile memory is subjected to many program and erase cycles, unwanted charge can accumulate in regions of the memory that are not supposed to accumulate charge. For example, looking back at FIG. 5, after many program and erase cycles, charge may get trapped and build up in the tunnel dielectric regions TD of the memory cells 404-410. This charge may make the memory cells harder and slower to program, and may cause errors when reading or erasing. Similarly, looking back at FIG. 6B, after many program and erase cycle, charge may get trapped and build up in the tunnel dielectric layer 472, which may make the memory cells harder and slower to program, and may cause errors when reading or erasing. Charge can also get trapped or migrate in charge trapping layer 473 of the embodiment of FIG. 6B, which can also lead to errors when programming, erasing and reading. The errors from this unwanted accumulation of charge can cause a good block of memory cells to become a bad block of memory cells. As discussed above with respect to FIG. 10, when controller 120 determines that a block is a bad block, that bad block is added to the bad block pool BBP (see FIG. 1) and no longer used to store host data. As a result, the capacity of the storage system is reduced.

It has been found that allowing such a bad block with unwanted charge accumulated in regions of the memory that are not supposed to accumulate such charge to remain idle over a long period of time (e.g., 1-2 months) results in some of the unwanted accumulation of charge dissipating. For example, some of the charge trapped in tunnel dielectric regions TD will migrate to substrate 402 or floating gate FG, or some of the charge trapped in tunnel dielectric layer 472 will migrate to the channel 471 or charge trapping layer 473. This migration will happen faster with higher temperatures. But forcing higher temperatures can damage other portions of the storage system 100 (e.g. controller 120 or control circuitry 310) or the host 102. If the block is allowed to be idle for a long enough time (e.g., 1-2 months), enough charge (e.g., electrons) will migrate such that the block will no longer exhibit errors during programming, erasing and reading. As a result, the block becomes a good block. This process for allowing the bad block to remain idle so that the unwanted accumulation of charge dissipates is referred to as self-curing.

Therefore, it is proposed that in response to determining that a particular block is a bad block, the one or more control circuits of the storage system will leave the particular block idle for a period of time such that no programming, reading or erasing is performed for the particular block during the period of idle time; however, programming, reading and erasing are performed for other blocks during that period of time. After the period of time for being idle has completed, the one or more control circuits of the storage system test whether the particular block is a bad block or a good block. If the particular block is now a good block again, then the particular block can be used to store host data in the same manner that other good blocks are used.

Figure 11:
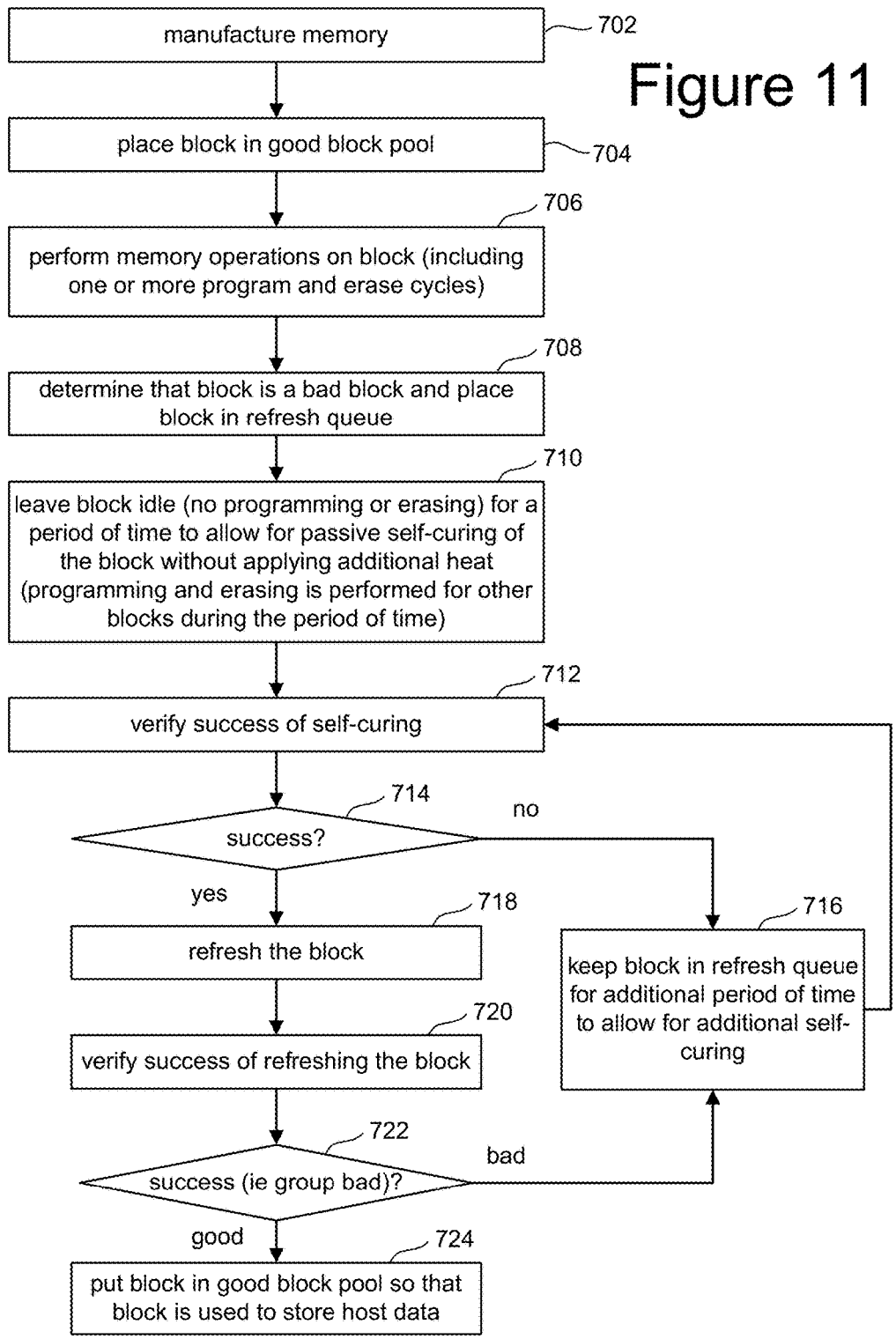
FIG. 11 is a flow chart describing one embodiment of a process for reclaiming bad blocks.

FIG. 11 is a flowchart describing one embodiment of a process for reclaiming bad blocks using self-curing. In step 702, memory is manufactured. For example, each of the memory dies 206 will be manufactured. In step 704, subsequent to manufacturing the memory dies 206, each of the memory dies will have their memory structures 326 tested to identify any bad blocks. Blocks can be tested by programming and reading data. Any blocks found to be bad blocks are placed in the bad block pool (BBP). In one embodiment, the bad block pool is a list or other identification of blocks determined to be bad. Those blocks in the bad block pool will not be used to store host data. Those blocks not found to be bad in the testing during or subsequent to manufacturing will be placed in the good block pool (GBP). In one embodiment, the good block pool GBP (See FIG. 1) is a list or other identification of those blocks that are good blocks and available to be used to store host data. In some embodiments, the system will not store a good block pool. Instead, any block that is not in the bad block pool is assumed to be a good block.

In step 706, storage system 100 performs one or more memory operations on a block. The process of FIG. 11 can be used to describe the lifecycle of a single block (any particular block). Thus, in one embodiment the process of FIG. 11 is performed on every block of a memory. Step 706 includes performing one or more program and erase cycles. The memory operations performed in step 706 are performed by any one of the one or more control circuits discussed above. In step 708, any one of the one or more control circuits determine that the block is a bad block. In one example embodiment, the controller 120 determines that a block is a bad block during the process of FIG. 10. For example the one or more control circuits can be configured to determine that the particular block (or other grouping of non-volatile memory cells) is a bad block because the particular block includes charge that is trapped in an incorrect location, as discussed above. In other embodiments, state machine 312 can be used to determine that a block is a bad block. A block can also be considered a bad block if a programming operation on the block fails or an erasing operation fails. An erase operation include an erase verify operation that indicates whether the erase operation was successful or failed.

If it is determined in block 708 that a block is bad, that block will be added to the refresh queue (RQ). In step 710, the one or more control circuits will cause the block (that has been determined to be a bad block in step 708) to be idle for a period of time to allow for passive self-curing of the block without additional heat being provided to the block. By leaving the block idle, no programming, erasing or reading is performed on the block. While the block is idle in step 710, programming reading and erasing is performed for other blocks during that same period of time. Step 710 is performed without applying additional heat in that there is no heating element added to a memory die 206 and storage system 100 to intentionally add heat. However, to the extent that storage system 100 is in an electronic device that is hot is not considered to be the application of additional heat. Because there is no additional heat being provided and there is no intentional act that causes electrons or other charge to migrate, the self-curing process of step 710 is considered passive. The period of time for the block to remain idle can include one to two months. In other embodiments, less than one month can be used. In other embodiments, more than two months can be used.

Figure 12:
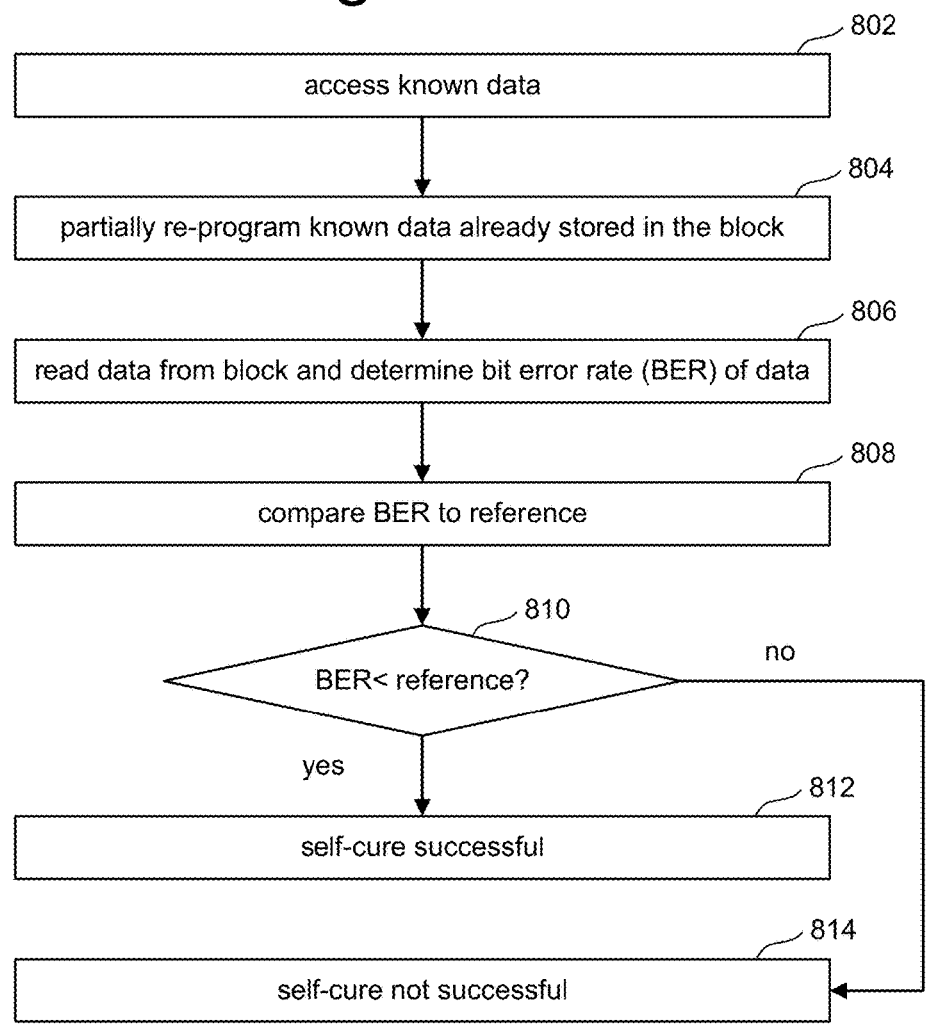
FIG. 12 is a flow chart describing one embodiment of a process for verifying success of self-curing.
Figure 13:
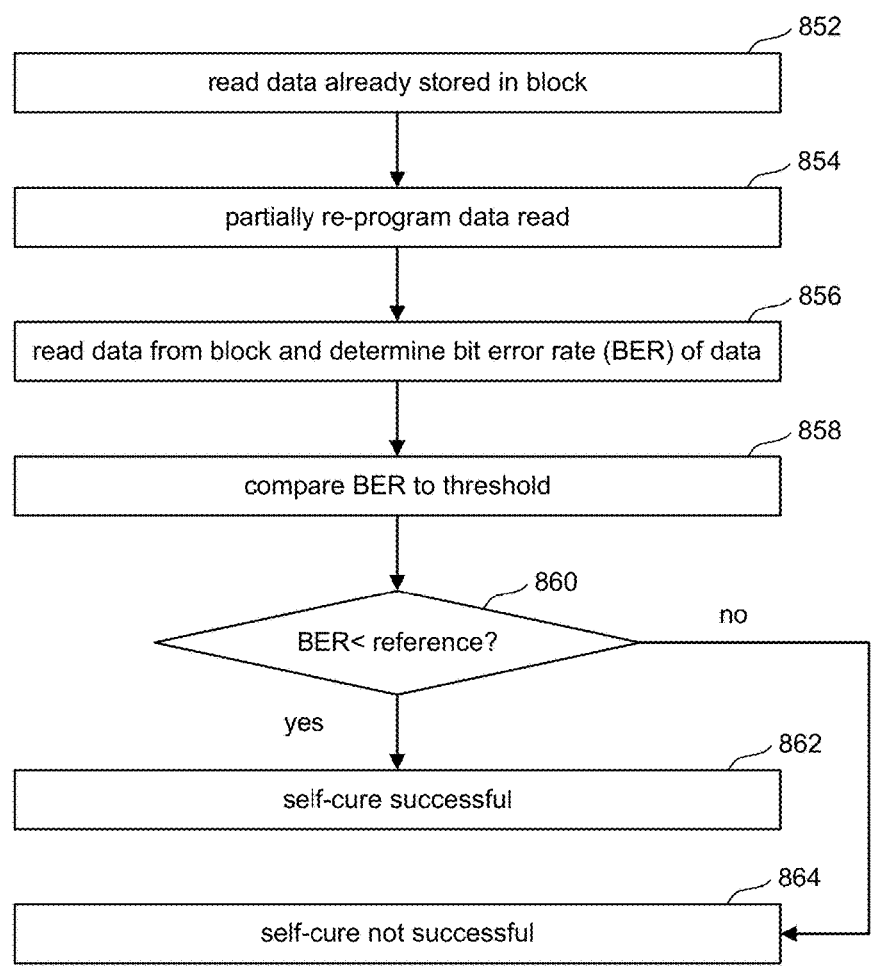
FIG. 13 is a flow chart describing one embodiment of a process for verifying success of self-curing.

In step 712, one or more control circuit verify the success of the self-curing process. That is, either the controller, state machine or another entity will determine whether the self-curing was successful. It is not necessary that the block is 100% perfect. Rather, the system needs to determine whether the block experienced enough self-curing so that it is possible that the block may become a good block. FIGS. 12 and 13 (discussed below) provide example implementations of step 712.

If it is determined (step 714) that the self-curing was not successful, then in step 716 the block remains in the refresh queue RQ for an additional period of time to allow for additional passive self-curing without applying additional heat. In one embodiment, the additional period of time is the same as the original period of time from step 710. In another embodiment, the additional period of time of step 716 is a fraction of the period of time used in step 710 for the self-curing process. After the additional period of time in step 716, the process loops back to step 712 and again attempts to verify the success of the additional self-curing.

If it is determined (step 714) that the self-curing was successful, then the block is refreshed in step 718. In one embodiment, a block is refreshed by performing an erase operation on the block. In step 720, the one or more control circuits verify the success of refreshing the block. One example of verifying the success of refreshing includes performing an erase verification. For example, looking back at FIG. 7, erasing the block may cause all the memory cells to move to State 0. An erase verification process can test whether the threshold voltages of the memory cells are below 0 volts. Other variations can also be used. Testing whether the refreshing was successful is a form of determining whether the block is still bad. If the refresh was successful (step 722) so that the block is no longer bad (the block is now a good block) then in step 724 the block is put in the good block pool GBP so that the block is used to store host data. If, in step 722, it is determined that the refreshing was not successful (that testing determined that the block is still a bad block) then then the process continues at step 716 so that the block remains in the refresh queue RQ for an additional period of time to allow for additional passive self-curing without applying additional heat. After the additional period of time in step 716, the process loops back to step 712 and again attempts to verify the success of the additional self-curing. In an alternative embodiment, if in step 722, it is determined that the refreshing was not successful then the block is moved to the bad block pool BBP so that it is no longer used to store host data. In one embodiment, blocks in the bad block pool BBP are not used at all.

In one embodiment, the one or more control circuits are configured to use a same standard for determining whether block of memory cells is a good block or a bad blocks before and after the period of time of step 710. That is, the standard used to identify a block as a bad block is the same for step 708 as it is for steps 720 and 722.

Steps 706-726 of FIG. 12 can be performed by any of the one or more control circuits discussed above. In one embodiment, steps 706-726 of FIG. 12 are performed by controller 120.

FIG. 12 is a flowchart describing one embodiment of a process for verifying self-curing. That is, the process of FIG. 12 is one example implementation of step 712 of FIG. 11. The process of FIG. 12 can be performed by any of the one or more control circuits discussed above. In one embodiment, the process of FIG. 12 is performed by controller 120.

Figure 12A:
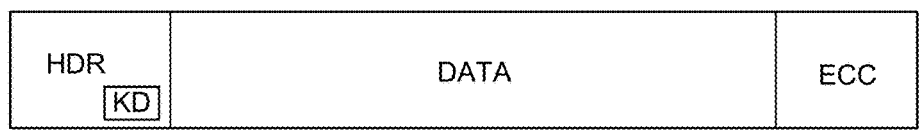
FIG. 12A is a block diagram depicting a page of data.

In step 802, the one or more control circuits will access known data. The process of FIG. 12 relies on the assumption that a known set of data was stored in the block prior to the block becoming a bad block. For example, a two byte pattern can be stored in a predictable location in the block. In other embodiments, more or less than two bytes can be used. As discussed above, in one example implementation, all the memory cells connected to a single word line form a single page of data. Thus, if a block has 64 word lines, then there will be 64 pages of data. FIG. 12A shows one example architecture for a page of data. The page of data of FIG. 12A includes a header (HDR), stored data (DATA) and error correction information (ECC). In one embodiment, the error correction information is combined with the data. The data can be host data being stored on behalf of host 102. Header information HDR includes information used by controller 120 to manage the memory, including indication of physical address, wear leveling information, garbage collection information, super block identification, etc. In one embodiment, the two bytes of known data KD are stored in a predetermined location within header HDR, as depicted in FIG. 12A in the first word line of a block, all programmed word lines of a block or a subset of word lines. That same known data KD can be stored in every single block, and also stored by controller 120 in volatile memory 140. In step 802, the known data is accessed from volatile memory 140 (or another location within the non-volatile memory).

In step 804, the one or more control circuits partially re-program the known data KD that is already stored in the block. A partial reprogram includes programming without first erasing. Additionally, the partial reprogram includes performing steps 572-586 of FIG. 9B (performed by the state machine at the direction of the controller) to add a small number of program pulses to clean up the data. In step 806, the known data is read back from the block (from the one or multiple pages). Step 806 includes performing the process of FIG. 10, which includes determining the bit error rate (BER) of the data read. In step 808, the BER is compared to a reference. If the BER is less than the reference (step 810), then it is concluded that the self-curing process was successful. If the BER was not less than the reference (step 810), then it is concluded that the self-curing process was not successful.

FIG. 13 is a flowchart describing another embodiment of a process for verifying the success of the self-curing. That is, the process of FIG. 13 is another example implementation of step 712. The process of FIG. 13 can be performed by any one of the one or more control circuits discussed above. In one embodiment, the process of FIG. 13 is performed by controller 120. In the embodiment of FIG. 13, the one or more control circuits are not aware of known data in the block. In step 852 of FIG. 13, the one or more control circuits read data already stored in the block. For example, one or more pages from the block will be read. In one example, the first word line (WL0) will be read. Step 852 can be performed using the process of FIG. 10. The result of step 852 is an estimation of the data stored in the block. In step 854, the one or more control circuits will partially reprogram that same data read into the same location. The partially reprogramming includes not performing an erase process. Instead, a small number of iterations of the process of FIG. 9B will be performed by the state machine at the direction of the controller. In another embodiment, the system can re-program data to another page. Various alternatives can use some smart combination (for example, something like XOR) of data of two pages (the same location and another location) with the goal of doing smart re-program operation that can check the page's state. In step 856, the data is read back again using the process of FIG. 10. This includes determining BER. In step 858, one or more control circuits will compare the BER to a reference. If the BER is less than the reference (step 860) then the one or more control circuits conclude that the self-curing process was successful. If the BER is not less than the reference (step 860), then it is concluded in step 864 that the self-curing process was not successful.

Figure 14:
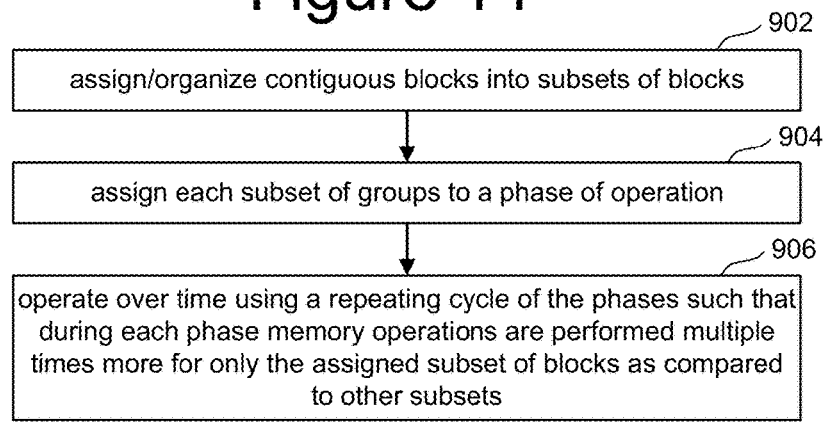
FIG. 14 is a flow chart describing one embodiment of a process for wear leveling.
Figure 15:
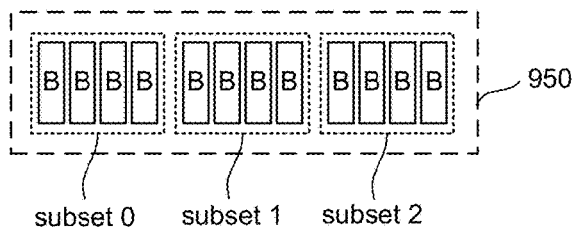
FIG. 15 depicts a set of blocks grouped into subsets.

FIG. 14 is a flowchart describing one embodiment of process for wear leveling when implementing the above-described process for reclaiming bad blocks. In step 902, the one or more control circuits assign contiguous blocks into subsets of blocks. In one embodiment, the blocks can already have been organized into subsets of blocks as part of the manufacturing or testing during manufacturing. For example, FIG. 15 shows a portion 950 of memory structure 326 that includes a plurality of blocks B. Contiguous blocks in portion 950 are organized into subsets including subset 0, subset 1 and subset 2.

The storage system operates in phases, where each phase is performed during a certain period of time. In step 904 of FIG. 14, the one or more control circuits (or another entity) will assign each subset of the groups to a phase of operation. For example, a system that has three phases of operation may have subset 0 assigned to phase 0, subset 1 is assigned to phase 1, and subset 2 is assigned to phase 2. The storage system operates over time using a repeating cycle of phases. That is, first phase 0 will be performed, followed by phase 1 being performed, followed by phase 2 being performed, followed by phase 0 being performed, followed by phase 1 being performed, followed by phase 2 being performed, followed by phase 0 being performed, etc. During each phase, memory operations are performed multiple times more for the subset of blocks that are assigned to that phase as compared to other subsets of blocks. For example, during phase 0, subset 0 will have its blocks subjected to a large number of memory operations while the blocks of subset 1 and/or subset 2 can be subjected to 0 or a very small number of memory operations. Thus, every block in a group that is currently in the phase that the block is assigned to will be worn out more intensively than other blocks not assigned to that phase. The blocks of the current group that is active in the current phase will likely encounter errors more frequently and more likely to end up in the refresh queue RQ discussed above. Then, when subsequent phases are performed, those blocks in the refresh queue can remain idle. Thus, looking back at FIG. 11, memory operations of step 706 can be performed for a block when that block is experiencing its assigned phase and the period of time to remain idle in step 710 when that block is experiencing a phase that it is not assigned to.

Figure 16:
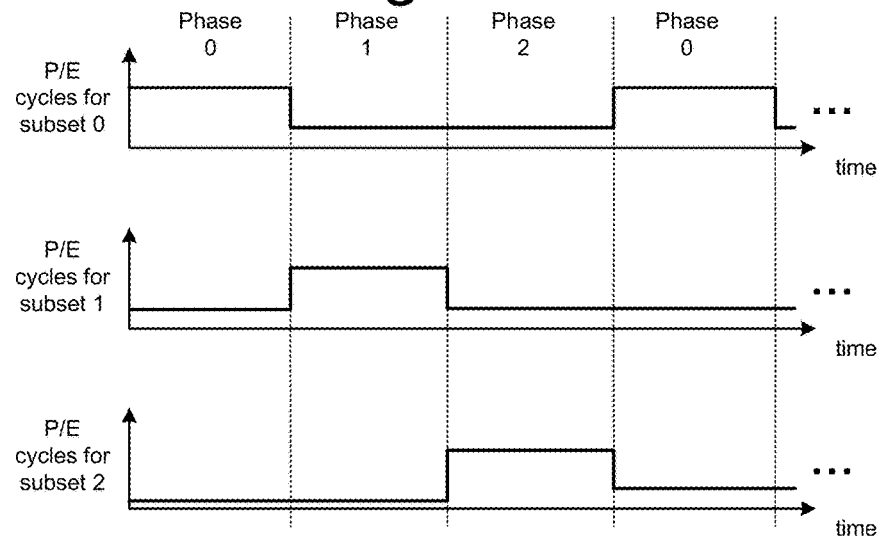
FIG. 16 is a timing diagram depicting multiple phases of a wear leveling scheme.

FIG. 16 graphically depicts the process of FIG. 14, showing phase 0, phase 1, phase 2, phase 0, . . . If there was more room on the page, FIG. 16 could depict additional repeating of phase 1, 2, 0, 1, 2, 0, etc. FIG. 16 shows three graphs. The top graph shows program and erase cycles for subset 0. The middle graph shows program and erase cycles for subset 1. The third graph shows program and erase cycles for subset 2. As can be seen, the number of program and erase cycles for subset 0 during phase 0 is very high and the number of program erase cycles for subset 1 and subset 2 are low. During phase 1, the number of program and erase cycles for subset 1 are very high, and the number of program and erase cycles for subsets 0 and 2 are very low. During phase 2, the number of program and erase cycles for subset 2 are very high and the number of program and erase cycles for subsets 0 and 1 are very low. Therefore, FIG. 16 graphically depicts performing multiple times more memory operations on a first subset of the blocks during a first time period as compared to memory operations performed in other subsets of the blocks during the first time period; and performing multiple times more memory operations on a second subset of the groups during a second time period as compared to memory operations performed on other subsets of the blocks during the second time period; and performing multiple times more memory operations on a third subset of the groups during a third time period as compared to memory operations performed on other subsets of the blocks during this third time period.

Although the above discussion used a block of non-volatile memory cells as a unit to operate on for reclaiming bad blocks, in other embodiments other types of groups of non-volatile memory cells can be utilized. Examples include a super block or a sub-block. A super block is the aggregation of multiple blocks. A sub-block is a portion of a block. Note that sometime a block can be referred to as an erase block.

One embodiment includes a non-volatile storage apparatus, comprising a plurality of non-volatile memory cells arranged as groups of non-volatile memory cells and one or more control circuits connected to the non-volatile memory cells and configured to determine that a particular group of non-volatile memory cells is a bad group and leave the particular group idle for a period of time such that no programming or erasing is performed for the particular group during the period of time and programming is performed for other groups of non-volatile memory cells during the period of time. The one or more control circuits are configured to determine that the particular group is no longer a bad group subsequent to the period of time and use the particular group to store host data in response to determining that the group is no longer a bad group.

In one embodiment, the one or more control circuits are configured to use a same standard for determining whether the particular group of non-volatile memory cells is a good group or a bad group before and after the period of time One embodiment includes a method for operating non-volatile storage, comprising: determining that a block of non-volatile memory cells is a bad block; leaving the block idle for a period of time to allow for passive self-curing of the block; verifying success of the self-curing; and using the block to store host data subsequent to verifying success of the self-curing.

One embodiment includes an apparatus, comprising: a host interface; a memory interface; and means, connected to the host interface and the memory interface, for determining that a block of non-volatile memory cells is bad, allowing the block to self-cure without applying additional heat and using the block to store host data subsequent to the self-cure.

Examples of a means for determining that a block of non-volatile memory cells is bad include the components of controller 120, such as processor 156 and/or ECC engine 158, both of which can be programmed by software (including firmware) or be implemented as a custom circuit without software. These components perform the processes of FIGS. 10-14.

Example of a means for allowing the block to self-cure without applying additional heat include the components of controller 120, such as processor 156 and/or ECC engine 158, both of which can be programmed by software (including firmware) or be implemented as a custom circuit without software. These components perform the processes of FIGS. 11-14.

Example of a means for using the block to store host data subsequent to the self-cure include the components of controller 120, such as processor 156 and/or ECC engine 158, both of which can be programmed by software (including firmware) or be implemented as a custom circuit without software. These components perform the processes of FIGS. 9A-14.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
    a plurality of non-volatile memory cells arranged as groups of non-volatile memory cells; and
    one or more control circuits connected to the non-volatile memory cells and configured to determine that a particular group of non-volatile memory cells is a bad group and leave the particular group idle for a period of time such that no programming or erasing is performed for the particular group during the period of time and programming is performed for other groups of non-volatile memory cells during the period of time, the one or more control circuits are configured to determine that the particular group is no longer a bad group subsequent to the period of time and use the particular group to store host data in response to determining that the group is no longer a bad group.

2. The non-volatile storage apparatus of claim 1, wherein:
    the one or more control circuits are configured to leave the particular group idle for the period of time to allow for passive self-curing of the particular group.

3. The non-volatile storage apparatus of claim 1, wherein:
    the one or more control circuits are configured to leave the particular group idle for the period of time to allow the block to self-cure without applying additional heat.

4. The non-volatile storage apparatus of claim 1, wherein:
    the one or more control circuits are configured to leave the particular group idle for the period of time to allow for self-curing of the particular group; and
    the one or more control circuits are configured to determine that the particular group has successfully completed the self-curing, the determining that the particular group is no longer a bad group is performed subsequent to determining that the particular group has successfully completed the self-curing.

5. The non-volatile storage apparatus of claim 4, wherein:
    the one or more control circuits are configured to refresh the particular group in response to determining that the particular group has successfully completed the self-curing;
    the one or more control circuits are configured to verify that the particular group was successfully refreshed; and
    the verifying that the particular group was successfully refreshed comprises the determining that the particular group is no longer a bad group.

6. The non-volatile storage apparatus of claim 5, wherein:
    the one or more control circuits are configured to refresh the particular group by performing an erase operation on the particular group; and the one or more control circuits are configured to verifying that the particular group was successfully refreshed by performing an erase verification.

7. The non-volatile storage apparatus of claim 4, wherein:
the one or more control circuits are configured to determine that the particular group has not successfully completed the self-curing and, in response thereto, provide for the particular group to remain idle for an additional period of time to allow for additional self-curing.

8. The non-volatile storage apparatus of claim 4, wherein:
the one or more control circuits are configured to determine that the particular group has successfully completed the self-curing by performing partial re-programming of known data already stored in the particular group of non-volatile memory cells, determining a bit error rate for the known data in the particular group of non-volatile memory cells after the partial re-programming and comparing the bit error rate to a reference.

9. The non-volatile storage apparatus of claim 4, wherein:
the one or more control circuits are configured to determine that the particular group has successfully completed the self-curing by reading data already stored in the particular group of non-volatile memory cells, performing partial re-programming of the data in the particular group of non-volatile memory cells based on the reading, determining a bit error rate for the known data in the particular group of non-volatile memory cells after the partial re-programming and comparing the bit error rate to a reference.

10. The non-volatile storage apparatus of claim 1, wherein:
the one or more control circuits are configured to use a same standard for determining whether the particular group of non-volatile memory cells is a good group or a bad group before and after the period of time.

11. The non-volatile storage apparatus of claim 1, wherein:
the groups of non-volatile memory cells are organized into subsets of groups; and
the one or more control circuits configured to operate over time using a repeating cycle of phases, during each phase the one or more control circuits are configured to perform multiple times more memory operations on only one of the subsets of groups as compared to other sub sets.

12. The non-volatile storage apparatus of claim 1, wherein:
the groups of non-volatile memory cells are blocks and the particular group is a particular block;
the plurality of non-volatile memory cells comprise two dimensional flash memory cells with floating gates and tunnel dielectric regions; and
the one or more control circuits are configured to determine that the particular block of non-volatile memory cells is a bad block because the particular block of non-volatile memory cells includes charge trapped in the tunnel dielectric regions.

13. The non-volatile storage apparatus of claim 1, wherein:
the groups of non-volatile memory cells are blocks and the particular group is a particular block; and
the plurality of non-volatile memory cells comprise a monolithic three dimensional flash memory that includes vertical NAND strings having charge trapping layers.

* * * * *